(12) United States Patent
Jarvis

(10) Patent No.: US 10,497,568 B2
(45) Date of Patent: Dec. 3, 2019

(54) SYSTEM AND METHOD FOR PRECISION FORMATION OF A LATTICE ON A SUBSTRATE

(71) Applicant: Denton Jarvis, Morgan, UT (US)

(72) Inventor: Denton Jarvis, Morgan, UT (US)

(*) Notice: Subject to any disclaimer, the term of this patent is extended or adjusted under 35 U.S.C. 154(b) by 110 days.

(21) Appl. No.: 15/699,180

(22) Filed: Sep. 8, 2017

(65) Prior Publication Data

US 2019/0080909 A1    Mar. 14, 2019

(51) Int. Cl.
*H01L 21/223* (2006.01)
*H01L 21/268* (2006.01)
*H01L 29/16* (2006.01)
*H01L 29/20* (2006.01)
*H01J 37/32* (2006.01)
*H01L 29/24* (2006.01)

(52) U.S. Cl.
CPC ........ *H01L 21/2236* (2013.01); *H01J 37/321* (2013.01); *H01J 37/32422* (2013.01); *H01J 37/32449* (2013.01); *H01L 21/268* (2013.01); *H01L 29/1606* (2013.01); *H01L 29/2003* (2013.01); *H01L 29/24* (2013.01); *H01J 2237/002* (2013.01); *H01J 2237/336* (2013.01)

(58) Field of Classification Search
CPC ..................................................... H01L 21/223
See application file for complete search history.

(56) References Cited

U.S. PATENT DOCUMENTS

| | | | |
|---|---|---|---|
| 5,519,215 A | 5/1996 | Anderson et al. | |
| 7,271,397 B2 | 9/2007 | Bryden et al. | |
| 9,312,117 B2 | 4/2016 | Hunter et al. | |
| 2015/0329957 A1 | 11/2015 | Anthony | |

*Primary Examiner* — Marvin Payen
(74) *Attorney, Agent, or Firm* — Morriss O'Bryant Compagni Cannon, PLLC

(57) ABSTRACT

A system and method for manufacturing a lattice structure of ionized particles on a substrate, wherein the process may be improved by controlling the number of ionized particles that are ejected from an ionizer and directed to a substrate, and wherein the ionized particles are disposed on the substrate, thereby enabling the creation of a lattice structure that may be as thin as a single layer of ionized particles.

11 Claims, 8 Drawing Sheets

SYSTEM AND METHOD FOR PRECISION FORMATION OF A LATTICE ON A SUBSTRATE

BACKGROUND OF THE INVENTION

Field of the Invention

This invention relates generally to a system and method for manufacturing a lattice structure of an ionized material on a substrate wherein the lattice structure may be as thin as a single layer of the ionized material. While examples in the embodiments may be directed to carbon as the ionized material, the embodiments may also include other materials that may form a lattice structure.

It is desirable to create one or more layers of lattice structures or crystalline lattice structures on a substrate because of the many useful industrial applications of such a structure from any material that can form a lattice structure. Such a material may be referred to as a "lattice material", a "lattice structure material" or as a "material forming a lattice structure" throughout this document. While the embodiments hereinafter may mention graphene, it should be understood that the lattice material that is formed into a lattice structure in these embodiments may include any material that can be vaporized and then condensed into the desired lattice structure, and is not limited to graphene.

In a prior patent document, a system and method was described for the formation of a lattice structure on a substrate. While the system and method of the patent will perform the desired function, it may be desirable to have greater control or precision over the ionized particles that are used to form the lattice structure. More specifically, it may be desirable to be able to have greater precision in the placement of ionized particles on a substrate to thereby more easily create a single layer of particles to form the lattice structure. Accordingly, it would be an advantage over the prior art to create a system and method that gives a user the ability to control a single ionized particle that is being used to form the lattice structure.

Using the example of carbon ions to create graphene (a single layer of carbon atoms), the U.S. Pat. No. 9,593,420 teaches a system and method that enables graphene to be created on a substrate at room temperatures and at atmospheric pressure.

As shown in FIG. 1, a block diagram of the prior art shows the components used to generate ionized particles that may be disposed on a substrate. It may be necessary to explain a portion of the prior art shown in FIG. 1 in order to describe the improvements of the present invention.

In the prior art, a first step was to provide a system that did not need to be sealed. In other words, no pressurized containment system was required to implement the system. Thus, the equipment disposed within a containment chamber 10 to provide a clean environment was not pressurized. A gas inlet 12 to the containment chamber 10 provided a means for introducing a gas into the containment chamber such as carbon dioxide. A gas outlet 14 from the containment chamber 10 led to an ambient air environment.

An agitating chamber 16 was used to generate the material to be formed into the lattice structure in a powdered form. In this example, carbon was provided in an aerosol form 18 through agitation so that it could be transported in a column of insert gas. For example, the carbon could be in the form of graphite if the objective is to obtain a lattice structure of graphene. Because graphite may be tacky, it was disposed within the agitating chamber 16.

FIG. 1 shows an agitating chamber 16 that contains a rotating brush 20 to assist in creating the aerosolized particles of carbon. The agitating chamber 16 also included an exit tube 22 that enabled the carbon to leave the agitating chamber.

The exit tube 22 was coupled to a mixing pump 24. The mixing pump 24 had no moving parts and included a second gas inlet 26. The second gas inlet 26 was used to introduce a gas such as carbon dioxide to the aerosolized form 18 of the material that is to form the lattice structure 18.

Carbon dioxide could be used as the gas because it can act as an inert gas when mixing with the carbon. The gas selected was preferably an inert gas relative to the material that is selected to form the lattice structure on the substrate. The mixing pump 24 could create a vacuum on the exit tube 22 to thereby function so as to draw the aerosolized carbon 18 from the agitating chamber 16 and into the mixing pump 24. The mixing pump 24 could also create a pressurized outlet 28. The carbon dioxide gas mixed with the aerosolized carbon 18 could be sent from the mixing pump 24 under some pressure to a head assembly 30. The pressure only had to be enough to draw the aerosolized carbon 18 from the agitating chamber 16.

The pressurized outlet 28 from the mixing pump 24 could feed the head assembly 30 that may be disposed on an actuator (not shown). The actuator may only function so as to move the head assembly 30 such that the head assembly may be pointed in a desired position above a substrate.

The head assembly 30 may contain at least one but typically several lasers 32. The aerosolized carbon 18 that is mixed in a stream of carbon dioxide gas may be directed to a location in the head assembly 30 so that the aerosolized carbon 18 may be heated by the one or more lasers 32 within a heating chamber 34 so that the carbon may be changed from a solid state into a gas. The lasers 32 may vaporize the aerosolized carbon 18 to prepare it for condensing into a desired lattice structure.

The aerosolized carbon 18 may be heated to a state where it is ionized which may be approximately 6500 degrees Fahrenheit, but the temperature may vary. What may be important is that the aerosolized carbon 18 be changed to a gas, and that the gas be ionized. The purpose for trying to obtain an ionized gas may be to increase the likelihood of the gas bonding with a substrate to create the desired lattice structure.

If a plurality of lasers 32 are used in the head assembly 30, the lasers may be positioned so as to focus on a desired location within the heating chamber 34 where the aerosolized carbon 18 may be changed to a gas. The aerosolized carbon 18 in the stream of gas may then be directed to the focusing point in the heating chamber 34 where the aerosolized carbon may be changed to a gas.

The heating chamber 34 led to a second chamber in the head assembly 30 that is referred to as the head chamber 36. The head chamber 36 may be surrounded by an electromagnet 38. Another purpose of the electromagnet 38 may be to create a magnetic valve. Thus, the electromagnetic field may be used to control the flow of ionized particles 40 from the head chamber 36. The focusing point of the head assembly 30 where the plurality of lasers 32 create the ionized particles 40 may be directly above a first hole 42 that leads from the heating chamber 34 and into the head chamber 36. There may also be a second hole 44 that leads from the head chamber 36. The ionized particles 40 would exit the second hole 44 to be discharged in a direction of and onto a substrate 50.

One of the problems of the prior art system shown in FIG. 1 is that it may be difficult to control the number of ionized particles 40 that are discharged from the head assembly 30, and where those ionized particles go on the substrate. Accordingly, it would be an improvement over the prior art to provide a system and method for controlling the number of ionized particles that may be discharged, and where they are disposed on the substrate.

BRIEF SUMMARY OF THE INVENTION

In a preferred embodiment, the present invention is a method and apparatus for manufacturing a lattice structure of ionized particles on a substrate, wherein the process may be improved by controlling the number of ionized particles that are ejected from an ionizer and directed to a substrate, and where the ionized particles are disposed on the substrate, thereby enabling the creation of a lattice structure that may be as thin as a single layer of ionized particles.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

In U.S. Pat. No. 9,593,420, the document explained how a new method and apparatus may be used to reduce the complexity of the manufacturing process of a lattice structure while increasing the output of graphene. However, unforeseen difficulties in the number of ionized particles that are created and in directing them to a desired location may prevent the desired outcome of a lattice structure. Accordingly, the first embodiment is directed to improvements in the system and method that enable the desired outcome.

Figure 1:
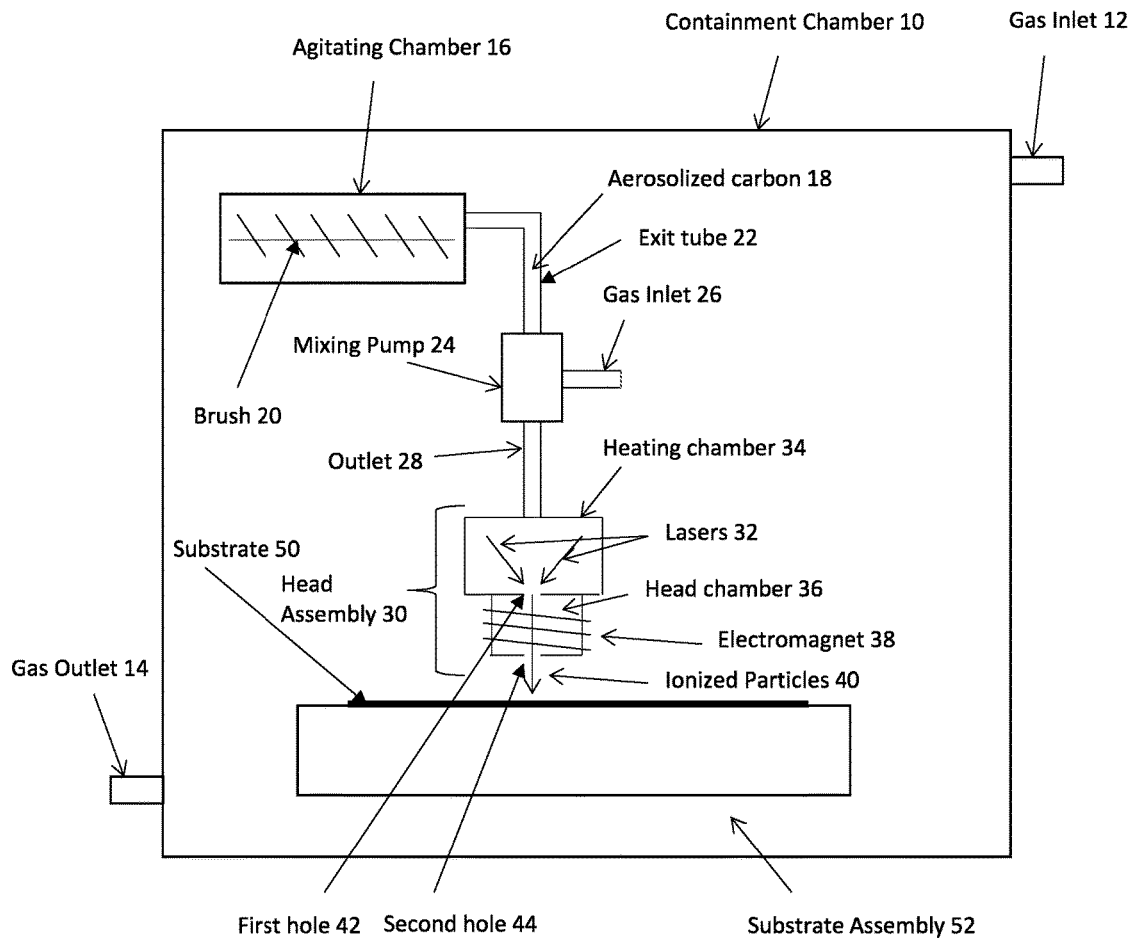
FIG. 1 is a block diagram of the components of a prior art system for manufacturing graphene on a substrate in accordance with the principles of the present invention.
Figure 2A:
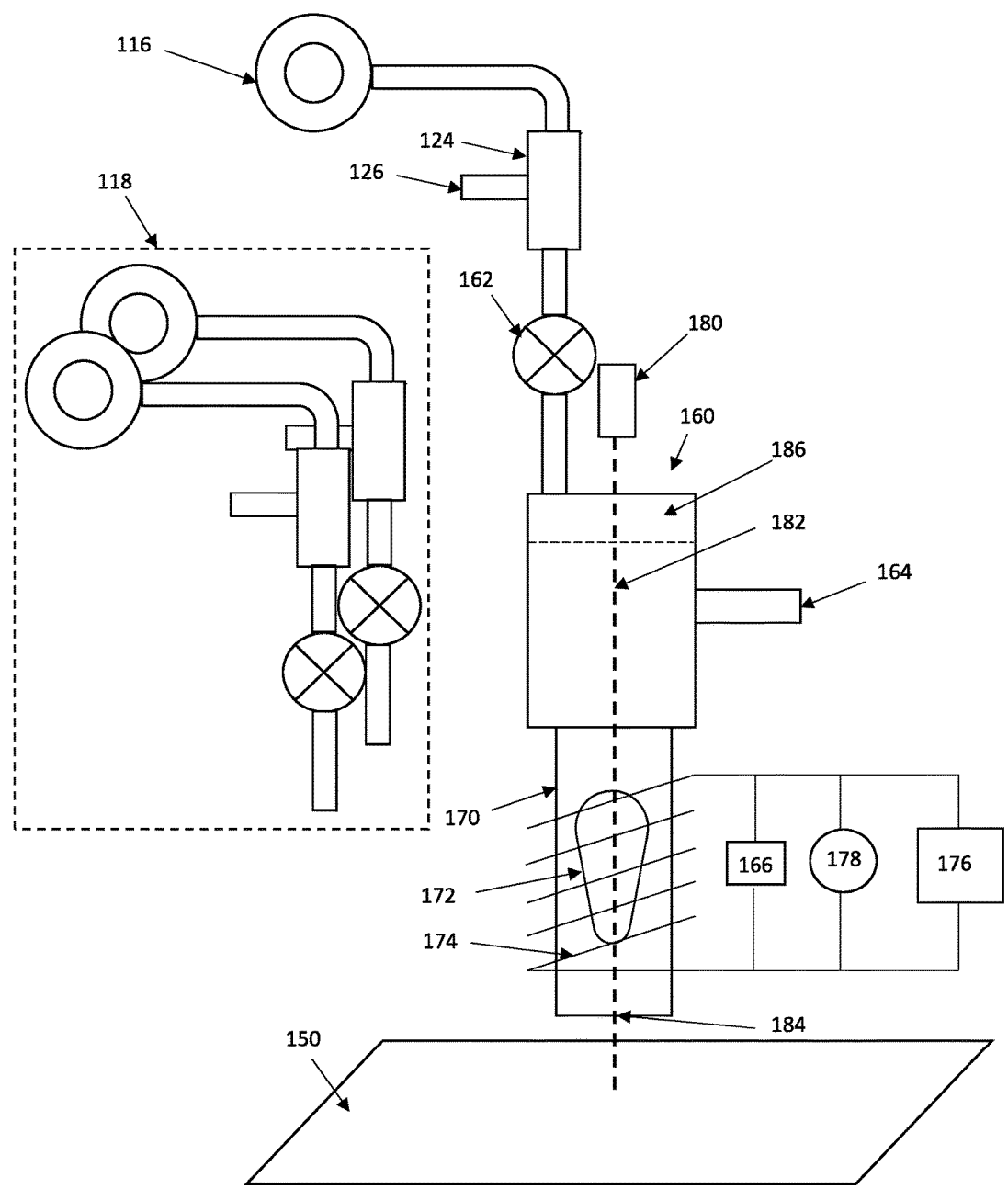
FIG. 2A is a diagram of an improved system for controlling the discharge of a single ionized particle from an ionizer and directing the ionized particle to a desired location on a lattice structure being manufactured on a substrate.
Figure 2B:
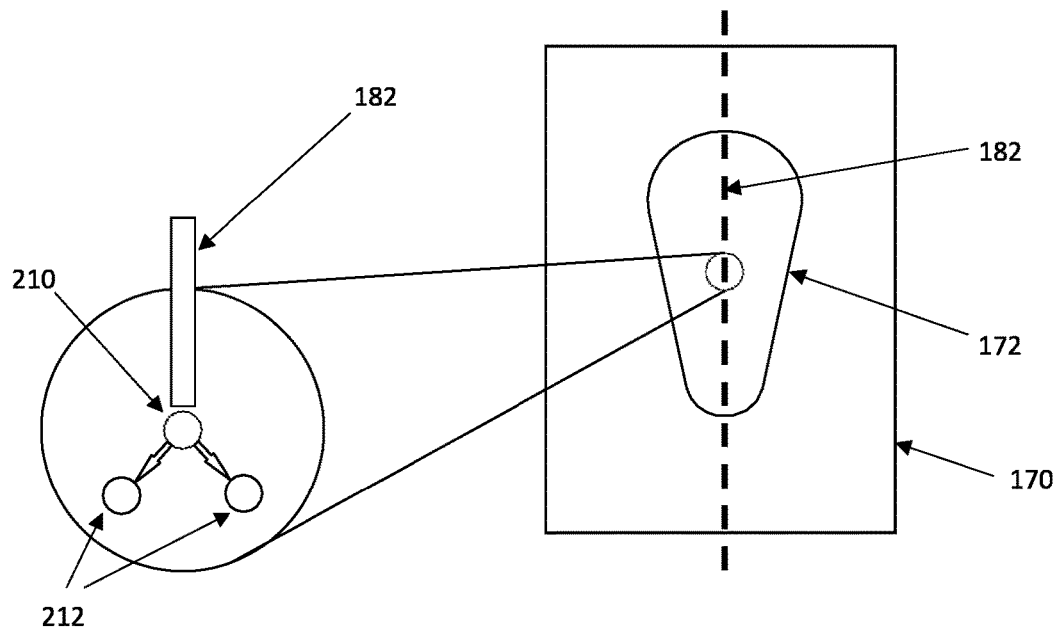
FIG. 2B is a close-up view of some of the interactions between ionized particles within the ionizer.
Figure 3:
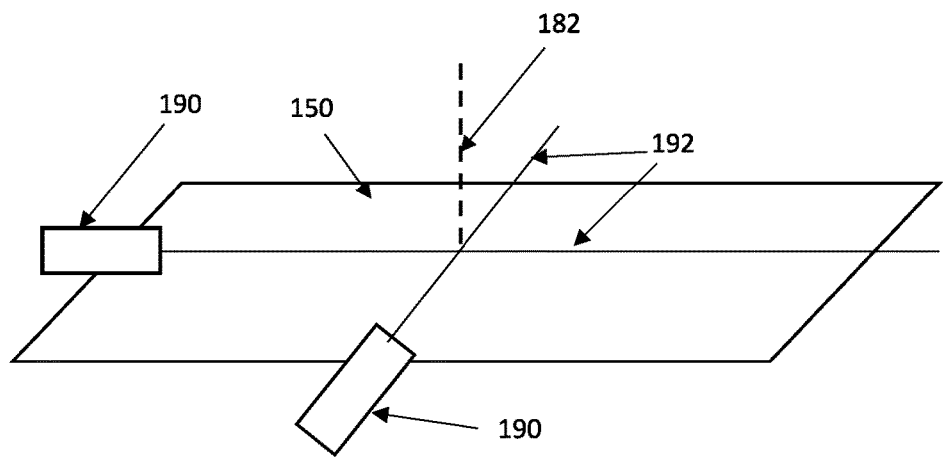
FIG. 3 is a perspective view of a substrate and lasers being used to control the placement of an ionized particle on a lattice structure on the substrate.
Figure 4:
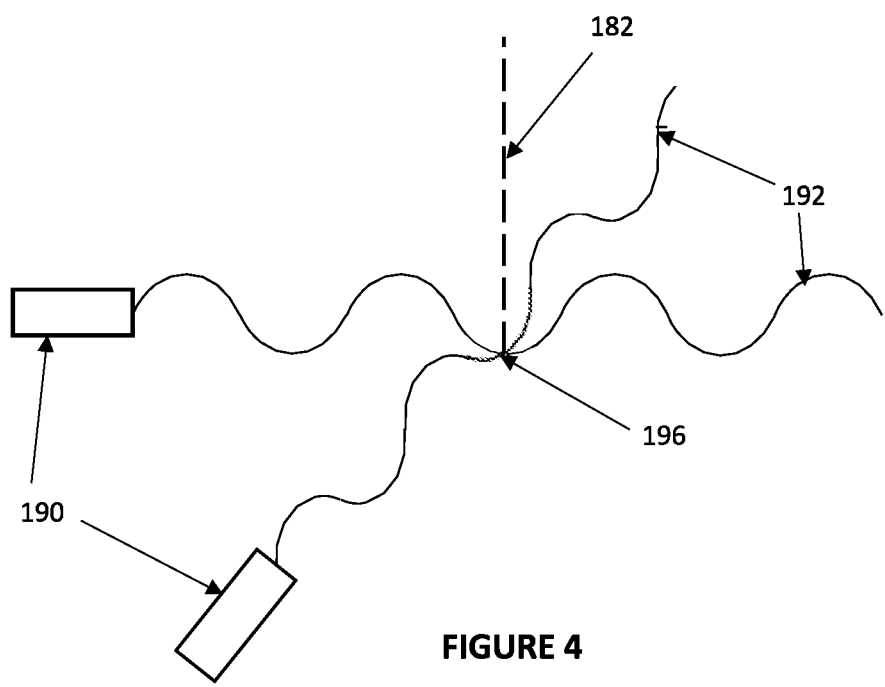
FIG. 4 is a perspective view of laser beams represented by standing waves to show how the position of an ionized particle is controlled on the substrate.
Figure 5:
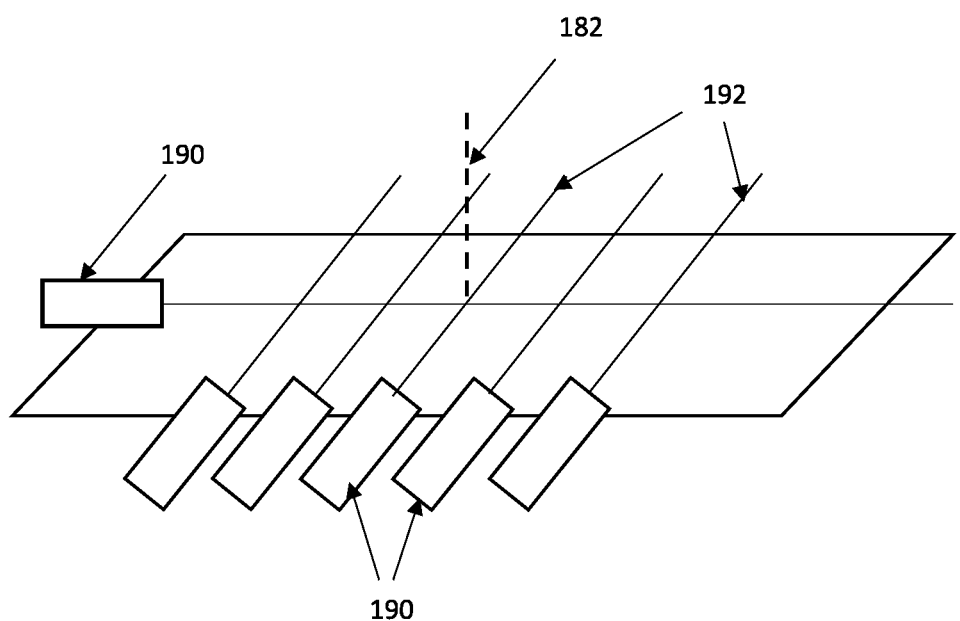
FIG. 5 is a perspective view of a plurality of laser beams that are used to control the placement of a plurality of ionized particles on the substrate.

Turning to FIG. 2A, a first improvement is that there may be one or more agitating chambers 116 used to generate the desired aerosolized particles. Each agitating chamber 116 may be coupled to a mixing pump 124 that has a gas inlet 126. The mixing pump 124 may function as a first venturi pump that mixes an insert gas such as argon or carbon dioxide with the aerosolized particles drawn from the agitating chambers 116 and sent on to a second larger venturi pump 160.

FIG. 2A shows that there may be more than one set of agitating chambers 116 and mixing pumps 124. Two additional agitating chambers 116, mixing pumps 124 and control valves 162 are shown within a dotted line box 118 to just represent any number of these devices that may be added to the system in order to provide aerosolized particles from multiple sources. Multiple agitating chambers 116 may enable the desired number of aerosolized particles to be obtained or different types of aerosolized particles. However, a single agitating chamber 116, mixing pump 124 and needle control valve 162 may be sufficient for the system to function.

If a plurality of agitating chambers 116, mixing pumps 124 and control valves 162 are added to the second larger venturi pump 160, it may be necessary to use a manifold 186 as indicated by the dotted line at the entrance to the second larger venturi pump. The manifold 186 may be included whether or not a plurality of agitating chambers 116, mixing pumps 124 and control valves 162 are needed, or it may be left out of the design of the second larger venturi pump 160 if it is known that they are not needed. However, the embodiments of the invention should be understood as having the option of including the manifold 186.

One or more sets of the agitating chambers 116 and mixing pumps 124 may all feed aerosolized particles to the larger second venturi pump 160 through a needle control valve 162. The needle control valve 162 may be used to control the flow of aerosolized particles to an ionizer 170 once a plasma ball 172 is ignited.

The second venturi pump 160 may also include a gas inlet 164 for an inert gas to be introduced such as argon. The second venturi pump 160 may be used to draw the aerosolized particles into the ionizer 170 from the mixing pump 124. The inert gas that flows into the second venturi pump 160 may be used to create a sufficient quantity of the inert gas to induce an induction plasma coil ignition within the ionizer 170.

It should be noted that the head assembly of the prior art is now replaced by the second venturi pump 160 and the ionizer 170.

The ionizer 170 may be comprised of a chamber having the shape of a tube. The ionizer 170 may be comprised of a quartz or sapphire material. What is important is that the characteristics of the ionizer 170 include having properties of a dielectric that may also able to withstand high temperatures. Accordingly, any material may be used for the ionizer 170 that is a conductive dielectric that is able to withstand the high temperatures that will be generated within the chamber.

FIG. 2A shows that the ionizer 170 may be surrounded by a coil of conductive metal tubing 174. For example, the metal tubing 174 may be comprised of copper or gold. A first function of the metal tubing 174 may be to allow a coolant to flow through it to reduce the temperature of the metal tubing. The coolant may be circulated by a pump 176 that is connected to the metal tubing 174. The coolant may be any coolant that is sufficient for reducing the temperature, such as water.

A second function of the metal tubing 174 may be to conduct an AC signal using an RF signal source 178. The frequency of the RF signal may be set to a resonant frequency that results in the necessary electrodynamic force to ionize the inert gas coming from the second venturi pump 160 such that it ignites to form a plasma ball 172 or plasma flume. The resonant frequency may be obtained through a matching impedance network 166 coupled to the metal tubing 174. An example of a resonant frequency that may be disposed on the metal tubing 174 is 13.56 MHz.

Once the inert gas within the ionizer 170 has ignited to form the plasma ball 172, the aerosolized particles being provided from the at least one first venturi pump 124 to the second venturi pump 160, and from the second venturi pump to the ionizer 170, are heated and may become ionized particles.

An advantageous thermodynamic property of the ionized gas forming the plasma ball 172 may be that the plasma ball will create a desirable draw on the flow of aerosolized particles arriving in the second venturi pump 160. However, if the flow of the aerosolized particles is not properly controlled, the flow of aerosolized particles could become too great and create too large a volume of aerosolized particles within the ionizer 170. Therefore, using at least one needle control valve 162 to control the flow of aerosolized particles from the mixing pump 124 may be an important aspect of the invention.

After the plasma ball 172 has been ignited, the volume within the ionizer 170 may be comprised of ionized particles, ionized inert gas and free electrons.

An important aspect of the first embodiment of the invention is the ability to be able to move a single ionized particle from the ionizer 170 and on to the substrate 150. This is accomplished by providing a pulse laser 180 to the system. The pulse laser 180 may be a high wattage device that may be disposed to direct a beam through the ionizer 170 and toward the substrate 150. Accordingly, the pulse laser 180 may be disposed so that a beam 182 is perpendicular to an exit port 184 at the bottom of the ionizer 170.

The pulse laser 180 may be located above the second venturi pump 160, or it may be located anywhere that enables the pulse laser to send a beam 182 through the ionizer 170. What is important is that if the pulse laser 180 is disposed outside the second venturi pump 160, that a window or access port be provided for the beam 182 to pass into the second venturi pump.

The pulse laser 180 may provide energy to a single ionized particle (which may now be referred to as the "targeted ionized particle 210" as shown in FIG. 2B) within the ionizer 170 so that free electrons within the ionizer do not create covalent bonds to a foreign material prematurely. The beam 182 may control a single targeted ionized particle 210 and push it through the exit port 184 and onto the substrate 150.

FIG. 2B illustrates the concept that if there may be more than one ionized particle that is perpendicular to the beam 182, these other ionized particles 212 may be repelled and directed out of the line of travel of the beam 182 and of the targeted ionized particle 210. An ionized particle that is offset from the beam 182 may also be pushed out of the way of the targeted ionized particle 210.

FIG. 3 shows another aspect of the first embodiment of the invention. This figure shows the substrate 150 that is disposed directly under the exit port 184 of the ionizer 170 and the beam 182 of the pulse laser 180. Another feature of the first embodiment is the use of at least two standing wave lasers 190 that may provide intersecting beams 192 under the exit port 184 and at the location that the beam 182 from the pulse laser 180 is directed at the substrate 150.

If the at least two standing wave lasers 190 are able to intersect their two beams 192 directly under the beam 182, they may be able to create an optical lattice. An optical lattice may be thought of as an egg crate shaped void in the standing waves that is formed to receive the targeted ionized particle 210 that is being pushed by the laser beam 182 out of the ionizer 170.

To help visualize the egg crate shaped void, FIG. 4 is provided to illustrate two sine waves that represent the beams 192 from the standing wave lasers 190 that are intersecting. The sine waves are shown intersecting at their lowest point in an oscillation, as shown by arrow 196.

The standing wave lasers 190 may be any laser that can provide the necessary standing wave such as an ultra-short pulse laser and an x-ray laser. It is also important to note that there may be more than the two standing wave lasers 190 for capturing the targeted ionized particle. For example, one standing wave laser 190 may be disposed parallel to the path of the ionizer 170 over the substrate 150. Then a plurality of standing wave lasers may be disposed along the length of the beam to create perpendicular standing waves at multiple locations and thereby create multiple optical lattice voids across the substrate 150 as shown in FIG. 5.

In an alternative embodiment, a single standing wave laser may be mounted on the ionizer 170. In other words, the standing wave laser may be mounted on the bottom of the ionizer 170 such that the proper optical lattice may be formed on the substrate 150 in order to control placement of the targeted ionized particle that is being ejected from the ionizer.

It should be understood that the standing wave lasers that are perpendicular to one another are also disposed parallel to the surface of the substrate, and they have amplitudes that are proportional to the electron levels required to provide ionized free electron energy levels for inducing covalent bond potentials.

One aspect of the invention is that it may be advantageous to cool the substrate below ambient temperature. The purpose of cooling may be to create a large thermal differential between the surface of the substrate 150 and the plasma ball 172 within the ionizer 170. The thermal differential may cause the targeted ionized particle to lose energy when it comes into contact with the substrate 150 and attaches to the lattice structure being manufactured.

The walls of the optical lattice voids being created by the standing wave lasers 190 provide free energy for the targeted ionized particle. The free energy may be provided by the beams 192 and may prevent the targeted ionized particle's valence electrons from creating covalent bonds prematurely with a foreign material. Furthermore, the first embodiment may use harmonics related to the resonance frequency because of the possible Gaussian intensity limitation.

The standing wave laser's beam 192 may cause the targeted ionized particle to remain ionized to a particular energy level. For example, a particular energy level of an ionized carbon atom may be a +4 charge, meaning that the targeted ionized particle could form four potential covalent bonds.

The wavelength of the standing wave laser's beam 192 may be selected in order to target a specific ionized particle. For example, the distance between two or more carbon atoms that form a lattice structure of graphene is 0.142 nm.

Dividing the speed of light by the wavelength may be an approximation of the frequency of the standing wave beam 192. The frequency of the standing wave may be the resonance frequency of the targeted ionized particle when the particle is an ionized atom of carbon.

Therefore, a different resonance frequency of the standing wave generated by the standing wave lasers 190 may be selected based upon the ionized particle of interest in order to create the appropriate covalent bonds to neighboring particles that form the lattice structure being created on the substrate 150.

It may be helpful to understand that the point of overlap of the perpendicular standing waves 192 may induce an artificial Dirac cone energy level. This Dirac cone may provide the necessary protection of the free electron needed to induce an actual Dirac cone electron once the beam 182 of the pulse laser 180 moves to a next ionized particle to be covalently bonded to the lattice structure on the substrate 150. An example of a Dirac cone lattice structure material is graphene.

An inert environment is required for the lattice structure to be created on the substrate 150. For example, the system may be disposed within a sealed chamber where there is an atmospheric exchange from an ambient air mixture to argon.

Once the standing wave lasers 190 and pulse laser 180 are being used to create a next row of a lattice structure, the inert environment may be used to maintain the Dirac cone electron free of outside influences. Furthermore, when a different ionized particle is desired on the substrate, it may require a different harmonic resonance frequency and the standing waves lasers 190 may be adjusted accordingly.

It should be noted that more than one layer of a lattice structure may be created by each pass of the ionizer 170 over the substrate 150, or each pass of the substrate under the ionizer.

One advantage of using a plurality of agitating chambers 116 is that more than one element could be used to create ionized particles in order to provide variations in the manufactured lattice structure. For example, a first agitation chamber 116 could provide aerosolized particles of a first material, and a second agitation chamber may provide aerosolized particles of a second material that is different from the first material.

One aspect of the invention is related to the movement of the substrate 150 or the ionizer 170 in order to create the lattice structure. The movement may be thought of as a printing action where movement of the substrate 150 or the ionizer 170 enables printing of the lattice structure using the ionized particles. However, use of the word "printing" should not be considered as limiting or restricting the actual function being performed, which is to create one or more layers of the lattice structure on the substrate 150.

It should also be understood that at any time, the direction of movement of the substrate 150 may also be changed so that it moves incrementally under the ionizer 170. The purpose of changing the direction of movement of the substrate 150 is to enable another layer of the lattice structure to be deposited on a previous layer. In this way, multiple layers of the lattice structure may be built up if that is desired. The lattice structure may be built up or printed in as many layers as desired on the substrate 150.

In another aspect of the embodiment, instead of the ionizer 170 moving relative to the substrate 150 in order to print the lattice structure on the substrate, the ionizer may be kept stationary and the substrate may be moved.

In another aspect of the embodiment, the method and system above may be used to manufacture other materials that may be disposed as a thin layer. For example, the system and method may be used for the manufacturing of Molybdenum sulfide and Boron Nitride. It should be understood that these materials are for illustration purposes only and should not be considered as limiting factors of this embodiment. Any material that is capable of being formed into a stream of ionized particles and then condensed into a lattice structure on any appropriate substrate may be used in the embodiments of the invention.

It should be noted that the containment chamber 10 that also encloses the embodiments of the invention may have a variable pressure. The variable pressure may be useful in order to facilitate transformation of the particular element that is being turned into ionized particles and then condensed into a lattice structure on a substrate. Accordingly, the containment chamber 10 may include any appropriate means for increasing or decreasing the pressure within the containment chamber.

Figure 6:
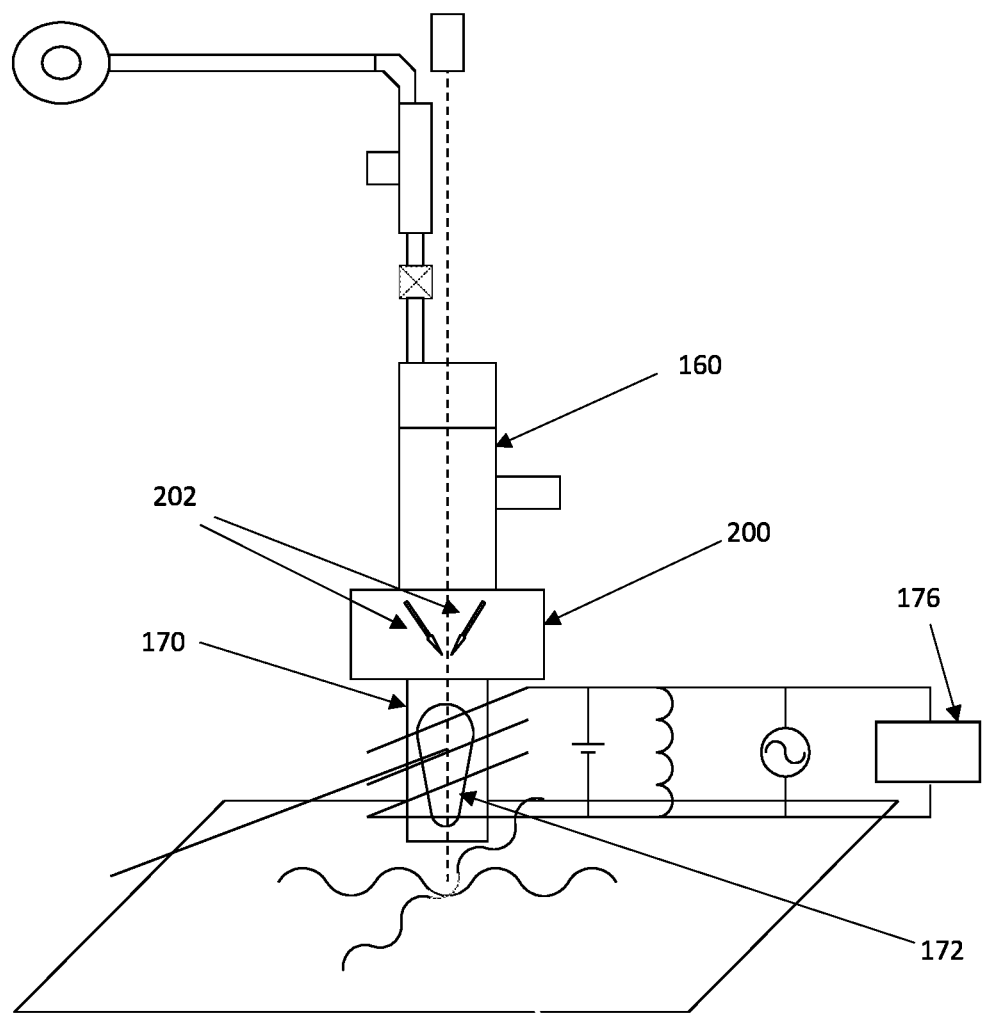
FIG. 6 is a second embodiment of the present invention.

It should be understood that there are additional embodiments that may also accomplish the function of the present invention. Beginning with a second embodiment shown in FIG. 6, this second embodiment inserts a laser preheating chamber 200 between the second venturi pump 160 and the ionizer 170 and uses a plurality of heating lasers 202 before the particles are sent to the induction plasma ball 172.

Figure 7:
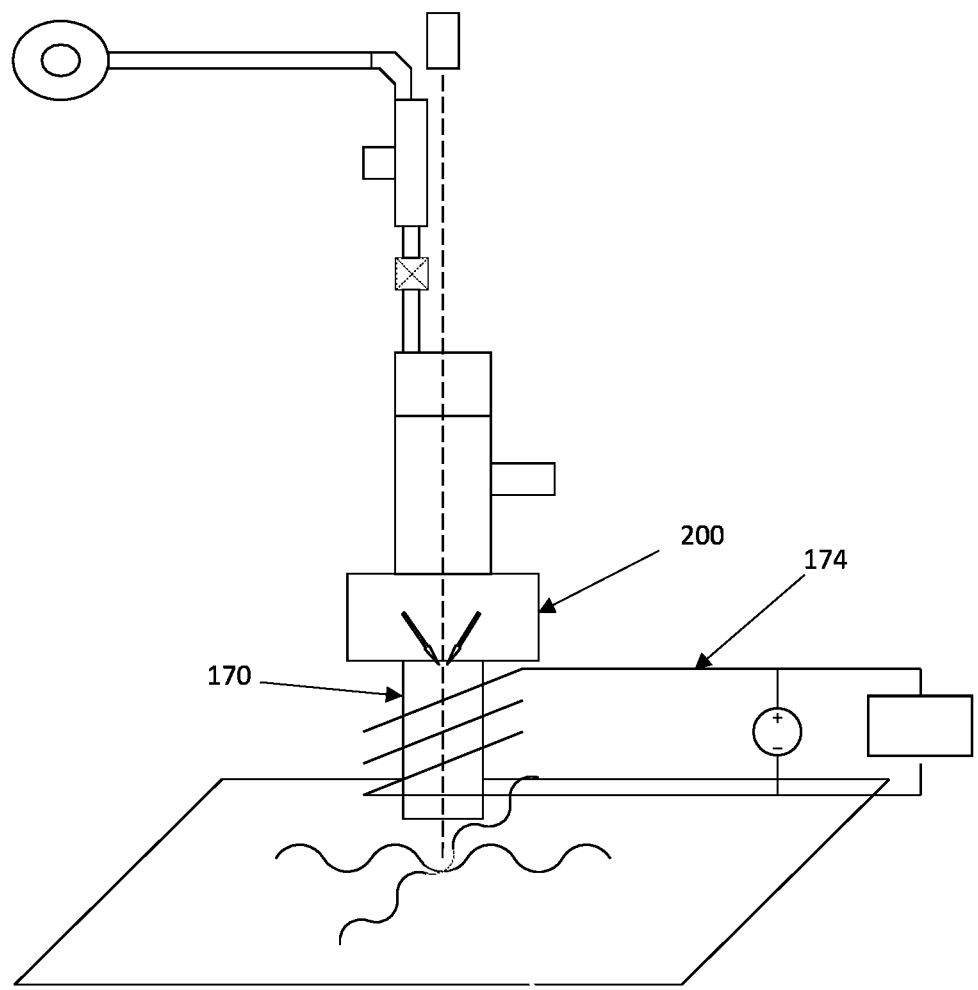
FIG. 7 is a third embodiment of the present invention.

FIG. 7 shows a third embodiment of the invention. In this third embodiment, the laser preheating chamber 200 is still present. The additional modification is that primary heating may now be performed in the laser preheating chamber 200, and particle acceleration and particle ionization may be accomplished using an electromagnet, for example, by applying a DC current to the metal tubing 174 instead of creating an induction plasma ball in the ionizer 170.

Figure 8:
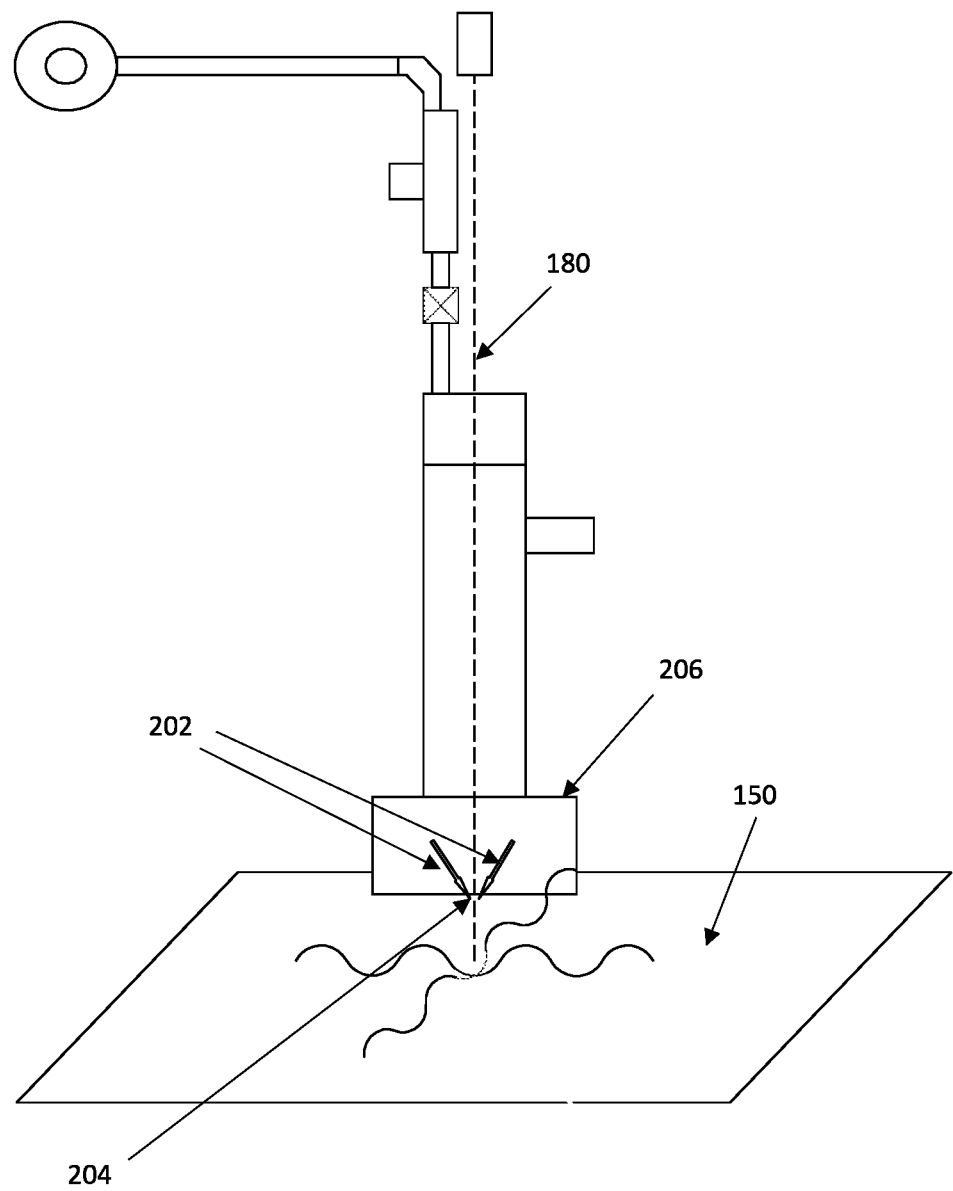
FIG. 8 is a fourth embodiment of the present invention.

FIG. 8 shows a fourth embodiment of the invention. This fourth embodiment eliminates the ionizer completely and instead relies on the pulse laser 180 and the heating lasers 202 for particle acceleration and ionization by focusing all the energy at a common focal point 204 within a heating chamber 206. It should be understood that the focal point 204 will necessarily have to be close to the surface of the substrate 150 in order to prevent the ionized gas in the heating chamber 206 from cooling too quickly before reaching the substrate.

Each of the embodiments may have particular advantages related to design footprint, precision miniaturization, power consumption, ease of implementation and the different possible thermodynamics properties.

Another factor that should be considered when implementing the embodiments of the invention is related to the pulse laser. The intensity of the pulse laser beam may be realized as a Gaussian bell curve. The shape of this curve may dictate how precise the ionized particle grouping may be achieved at the substrate being held within the optical lattice.

Using a lower intensity pulse laser may create a wider area for the ionized particles to gather. This may result in additional power being required to push the additional population of ionized particles to the surface of the substrate.

In a final comment, because of the dependency of the surface area caused by the Gaussian intensity beam, it may have a direct correlation to the wavelengths chosen for the standing wave lasers as well as the required amplitude to ensure the population of ionized particles are sufficiently ionized within the optical lattice and are contained within each trough's volume of the optical lattice. The bigger the surface area, the higher the amplitude that is required. It is suggested that the wavelength harmonics are multiples based on the ideal situation.

Ideally, the intensity of the pulse laser is based on the width of one ionized particle's covalent electron shells, while the standing wave lasers are in the X-Ray wavelength range in order to match the covalent election shells width. The amplitude may be chosen to be a multiple of the required electron energy level to induce proper ionization of the particle of interest.

In contrast, using a higher intensity pulse laser may create a smaller area for ionized particles to gather. Accordingly, the smaller area may require less energy to push the population of ionized particles to the surface of the substrate. However, it may be more difficult to achieve the required focus from the laser diodes being used to create the pulse laser beam.

Only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A method for manufacturing a lattice structure on a substrate from a plurality of ionized particles, said method comprising:

providing a containment chamber that is substantially at atmospheric pressure;

creating a plurality of ionized particles within an ionizer using an induction plasma coil;

providing a pulse laser to generate a pulse laser beam to select and push a single ionized particle from the ionizer toward a substrate within the containment chamber;

providing two standing wave lasers that are perpendicular to each other but in a plane of the substrate, wherein the two standing wave lasers generate two laser beams that intersect each other and the ionized particle above the substrate; and disposing the ionized particle on the substrate at atmospheric pressure to thereby form a lattice structure.

2. The method as defined in claim 1 wherein the method further comprises selecting the substrate from the group of substrate materials comprised of any material that is capable of bonding with the ionized particles.

3. The method as defined in claim 1 wherein the method further comprises repeating the process of using the pulse laser to select and push the ionized particle from the ionizer toward the substrate to build the lattice structure.

4. The method as defined in claim 1 wherein the method further comprises:

creating an aerosolized form of the particles to be ionized;

mixing the aerosolized form of the particles with a first gas in a first venturi pump;

delivering the aerosolized form of the particles with the first gas from the first venturi pump to a second venturi pump;

mixing the aerosolized form of the particles with a second gas and delivering the mixture to the ionizer; and igniting the second gas within the ionizer to form a plasma ball and ionizing the aerosolized form of the particles to form a plurality of ionized particles within the ionizer.

5. The method as defined in claim 4 wherein the method further comprises selecting the particles to be ionized from the group of materials comprised of any material that may be heated to create the ionized particles and then positioned on the substrate to form the lattice structure.

6. The method as defined in claim 4 wherein the method further comprises:

providing a conductive metal tubing in a coil around the ionizer; and providing an RF signal on the conductive metal tubing to thereby generate a signal that ignites the second gas within the ionizer to form the plasma ball, wherein the RF signal is set to a resonant frequency of the second gas using a matching impedance network that is coupled to the conductive metal tubing.

7. The method as defined in claim 6 wherein the method further comprises connecting a coolant pump to the conductive metal tubing such that a coolant is pumped through the conductive metal tubing to cool the conductive metal tubing.

8. The method as defined in claim 4 wherein the step of creating an aerosolized form of the particles to be ionized further comprises:

providing at least one agitating chamber;

disposing a powdered form of the particles to be ionized into the agitating chamber; and agitating the particles to be ionized to create the aerosolized form of the particles to be ionized in the agitating chamber.

9. The method as defined in claim 1 wherein the method further comprises moving the ionizer or the substrate to thereby print the lattice structure on the substrate.

10. The method as defined in claim 4 wherein the method further comprises disposing a laser preheating chamber in front of the ionizer to thereby heat the aerosolized form of the particles before the particles enter the ionizer.

11. The method as defined in claim 1 wherein the method further comprises changing the pressure within the containment chamber to be something other than substantially atmospheric pressure.

* * * * *